United States Patent
Bausov et al.

(10) Patent No.: US 8,072,367 B1
(45) Date of Patent: Dec. 6, 2011

(54) ORGANICALLY REACTIVE CELL FOR UNDERGROUND SENSING (ORCUS) AND SYSTEM

(75) Inventors: Igor Bausov, Raton, NM (US); Gerald Stolarczyk, Raton, NM (US); Larry G. Stolarczyk, Raton, NM (US)

(73) Assignee: Stolar, Inc., Raton, NM (US)

( * ) Notice: Subject to any disclaimer, the term of this patent is extended or adjusted under 35 U.S.C. 154(b) by 67 days.

(21) Appl. No.: 12/815,423

(22) Filed: Jun. 15, 2010

(51) Int. Cl.
*G01S 13/56* (2006.01)
*G01S 13/04* (2006.01)
*G01S 13/00* (2006.01)

(52) U.S. Cl. ............ 342/22; 342/21; 342/27; 342/28; 342/82; 342/89; 342/90; 342/91; 342/118; 342/128; 342/146; 342/147; 342/175; 342/195

(58) Field of Classification Search ........... 342/21, 342/22, 27, 28, 82, 89–91, 118, 128–133, 342/159, 175, 195, 146, 147; 343/700 MS
See application file for complete search history.

(56) References Cited

U.S. PATENT DOCUMENTS

| | | | | | |
|---|---|---|---|---|---|
| 3,599,197 | A | * | 8/1971 | Boyko | 342/28 |
| 3,725,854 | A | * | 4/1973 | Otsuka | 342/28 |
| 3,775,765 | A | * | 11/1973 | Di Piazza et al. | 342/22 |
| 3,805,263 | A | * | 4/1974 | Ueda | 342/27 |
| 4,072,941 | A | * | 2/1978 | Hamid et al. | 342/22 |
| 4,368,460 | A | * | 1/1983 | Clinard et al. | 342/27 |
| 4,405,925 | A | * | 9/1983 | Lindner et al. | 342/28 |
| 4,908,615 | A | * | 3/1990 | Bayraktaroglu | 343/700 MS |
| 5,883,591 | A | * | 3/1999 | McEwan | 342/22 |
| 6,448,924 | B1 | * | 9/2002 | Hafer, Jr. | 342/28 |
| 6,512,475 | B1 | * | 1/2003 | Bogatyrev et al. | 342/22 |
| 6,522,285 | B2 | * | 2/2003 | Stolarczyk et al. | 342/22 |
| 6,624,781 | B1 | * | 9/2003 | Collins | 342/22 |
| 6,778,132 | B2 | * | 8/2004 | Palata | 342/175 |
| 7,256,727 | B2 | * | 8/2007 | Fullerton et al. | 342/28 |
| 7,320,271 | B2 | * | 1/2008 | Hintz | 342/22 |
| 7,382,312 | B2 | * | 6/2008 | Hintz | 342/90 |
| 7,567,206 | B1 | * | 7/2009 | Schmidt et al. | 342/175 |
| 2002/0008655 | A1 | * | 1/2002 | Haj-Yousef | 342/22 |
| 2002/0011947 | A1 | * | 1/2002 | Stolarczyk et al. | 342/22 |
| 2003/0184467 | A1 | * | 10/2003 | Collins | 342/22 |
| 2004/0095270 | A1 | * | 5/2004 | Palata | 342/175 |
| 2006/0087471 | A1 | * | 4/2006 | Hintz | 342/22 |
| 2006/0152404 | A1 | * | 7/2006 | Fullerton et al. | 342/28 |
| 2007/0241954 | A1 | * | 10/2007 | Hintz | 342/90 |

* cited by examiner

*Primary Examiner* — Bernarr Gregory
(74) *Attorney, Agent, or Firm* — Richard B. Main (57) ABSTRACT

A movement detection system includes a microwave antenna able to transmit microwave frequency signals into a space. An electronics controller is connected to the microwave antenna, and is configured to continually measure the impedance of the microwave antenna while it transmits microwave frequency signals into the space. An interpretive device is connected to receive impedance measurements from the electronics controller, and is configured to interpret and report changes in the magnitude and phase angles of individual impedance measurements as the passing of things and their direction through the space.

10 Claims, 6 Drawing Sheets

ORGANICALLY REACTIVE CELL FOR UNDERGROUND SENSING (ORCUS) AND SYSTEM

FIELD OF THE INVENTION

The present invention relates to electronic sensing devices, and more particularly to sensors and systems that can detect and characterize the movements of human and animals from behind non-metallic walls and pipes.

DESCRIPTION OF THE PRIOR ART

Sometimes having electronic sensors and cameras placed in public view is beneficial. For example, traffic speed and red-light cameras help deter speeding and running red lights simply because they are present. Some States even post signs saying cameras are watching when they are not, and many companies sell dummy cameras that look like the real thing and have blinking red LED lights to look like they are operational.

Very often these cameras and sensors are vandalized for sport, and others are deliberately disabled by criminals in the act of their crime or who plan to return later. So these situations require instrument placements that are either unreachable without special equipment, or that are distant or hidden.

A special situation has developed at the Southern Borders of the United States. Storm drains and conduits were installed years ago to control water and sewage in cities straddling the International Border. Various grates, bars, and other barriers were installed but these have been defeated by contraband smugglers and human traffickers. The new generation of criminals assaulting the borders are determined, numerous, well-equipped, and many times lavishly financed. These groups have taken to completely destroying all security equipment and sensors within hours or days of their installation. Of course, the more visible and vulnerable a piece of equipment is, the more readily it can be targeted.

There is a need for a device and system that can electronically detect and characterize the movements of humans, invisibly, such as from behind non-metallic walls and pipes. The equipment is protected by its not being visible to passersby.

SUMMARY OF THE INVENTION

Briefly, a people detection and movement embodiment of the present invention comprises a resonant microstrip patch antenna (RMPA) for mounting on an outside wall of a tunnel or concrete pipe and faced inward to detect the presence and direction of movement of people inside. The RMPA has a front lobe and a back lobe that react differently to dielectric changes in their fringing and propagating e-fields. A sensor controller connected to the RMPA drives the RMPA with a variable frequency until frequency resonance is detected. The impedance and phase of the RMPA are measured while it is resonance. People moving near the RMPA will affect the dielectric constant of the intervening concrete wall and surrounding air. Such changes in the dielectric constant affect the resonant frequency, impedance, and phase. The phase changes are indicative of the direction the people are moving relative to the RMPA, and the delta frequency and impedance changes indicate the mass and proximity of the people to the RMPA. A threshold detector is employed to screen out false positives and the movements of small animals. An interpretation of the changes in resonant frequency, impedance, and phase, is output to annunciate people movement and their direction of travel.

These and other objects and advantages of the present invention will no doubt become obvious to those of ordinary skill in the art after having read the following detailed description of the preferred SPS receivers which are illustrated in the various drawing figures.

IN THE DRAWINGS

FIGS. 6A-6C are schematics of an RMPA shown in cross-sectional view with a radiation pattern and an equivalent transmission line model. FIG. 6A shows the case where RMPA radiates into air or otherwise free space, FIG. 6B shows the case where a relatively thin concrete wall is intervening, and FIG. 6C shows the case where people occupy the free space on the other side of a concrete wall from an RMPA;

DETAILED DESCRIPTION OF THE PREFERRED EMBODIMENT

Figures 1, 5:
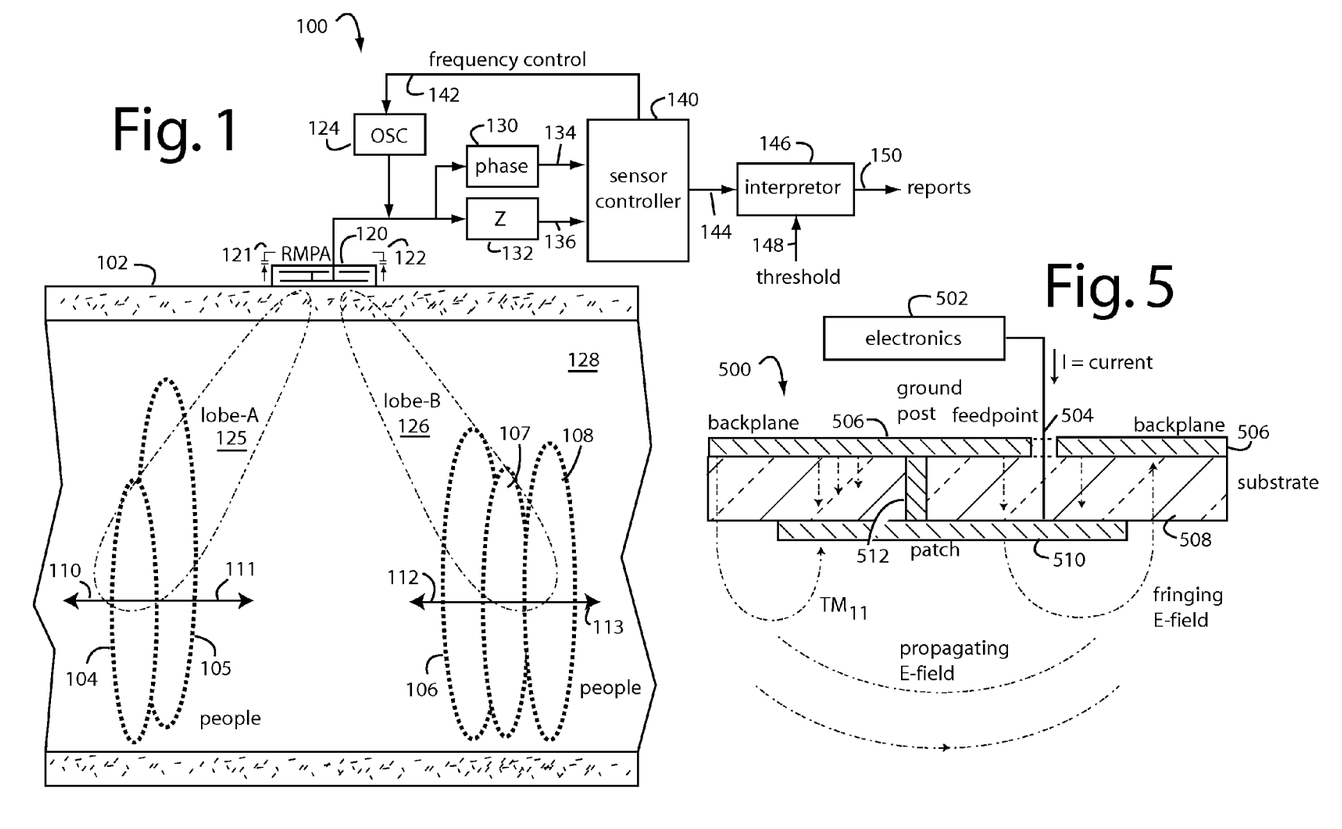
FIG. 1 is a functional block diagram showing a people detection and movement system embodiment of the present invention installed on a concrete pipe.
FIG. 5 is a cross sectional view of an RMPA like that in FIG. 1, wherein the cross section is taken through a plane that intersects both the ground post and feedpoint.

FIG. 1 illustrates a people detection and movement system embodiment of the present invention, and is referred to herein by the general reference numeral 100. In this application, system 100 is attached to an underground concrete storm drain pipe 102. It is possible for people 104-108 to walk through inside concrete pipe 102 in directions 110 and 111 for the left end, and directions 112 and 113 for the right end. System 100 can detect if the people 104-108 are on the left end of right end and which direction 110-113 they are moving.

A resonant microwave patch antenna (RMPA) 120 with tuning varactors 121 and 122 is excited by an oscillator 124. Useful ranges for OSC 124 can vary from 50-MHz up to 300-MHz and RMPA 120 is constructed to have a matching resonant frequency.

Highly simplified, the microwave frequency excitation of RMPA 120 by OSC 124 will produce two simultaneous lobes, a rear lobe-A 125 and a forward lobe-B 126.

The dielectric constant ($\in$) of air 128 inside concrete pipe 102 is about 1.00, the dielectric constant of water is about 80.4, and people 104-108 will also be about 80.4. So whether people 104-105 are inside lobe-A 125 and people 106-108 are inside lobe-B 126 will be in high contrast to the dielectric constant of air 128. Both lobe-A 125 and lobe-B 126 will be loaded by the presence of people 104-108, and both will detune RMPA 102 and change its resonant frequency. Loading, or people 104-105 appearing in lobe-A 125 will produce a negative phase change, and loading, or people 106-108 appearing in lobe-B 126 will produce a positive phase change. The magnitude of the loading or impedance (Z) and phase changes electronically produced in RMPA 102 will depend on the mass of people 104-108, their relative direction to and distance from RMPA 102. Small changes in Z or phase can be ignored as the movements of small animals. Standing or flowing water inside concrete pipe 102 will appear as a steady state base condition.

The physical size of the RMPA needed to match operation at resonance can vary quite a lot over the range of 50-MHz to 300-MHz. The size of RMPA 120 also depends on the dielectric constant of the substrate materials used in constructing it. Typically, the dimension of the metalized surface of the RMPA can be approximated as one quarter (¼) wavelength ($\lambda$) in the dielectric. Roughly, $D=\lambda/4 * 1/\sqrt{\epsilon}$, where $\lambda=c/f$, $\epsilon$ is the dielectric constant of the substrate material, c is the speed of light, and f is the frequency.

The higher the frequency, the smaller physically will be RMPA 120. The higher the dielectric constant of the substrate material used in RMPA 120, the smaller the RMPA has to be for resonant operation. However, at higher frequencies, the depth of penetration of lobe-A 125 and lobe-B 126 will be reduced because of attenuation. And, at higher dielectric constants for the substrate materials used, RMPA becomes less efficient and has much higher Q. So the right balance will be dictated by the particular application will usually have to be empirically determined. In a prototype system that was built, the RMPA had to resonate at 150-MHz. Using standard printed circuit board copper clad FR4 material for the substrate, the resulting RMPA was about eighteen inches in diameter.

The physical orientation of RMPA 120 is important relative to the line of travel of the people it is used to detect. RMPA 102 radiates off only two of its edges, whether it is a square patch, a rectangular patch, or even a circular patch. Every RMPA has a feedpoint, and here the feedpoint connects to two inputs, phase detector 130 and impedance detector 132. The radiating edges of the patch are the ones that form "perpendicular" lines with the axis of the feedpoint through the physical center point of the patch. Drawing an imaginary line from the feedpoint to the center of the patch, the edges of the patch that are tangent to such line are the radiating edges. Radiation from these edges produces a linear polarization, and this is the axis for which phase affects are the most pronounced. RMPA 120 is positioned such that people movement through lobes 125 and 126 is longitudinal to the imaginary line drawn from the feedpoint to the center of the patch. Such radiating edges are turned to be perpendicular to the expected directions of people travel. Inside a pipe, that can only be along the inside of the pipe. Two RMPA's set at right angles to one another could be used in spaces not so restricted.

Scattering parameters (s-parameters) describe the scattering and reflection of traveling waves when a network is inserted into a transmission line. Here, the transmission line is the air 128 inside concrete pipe 102. S-parameters are normally used to characterize high frequency networks, and are measured as a function of frequency. So frequency is implied and complex gain and phase assumed. The incident waves are designated by the letter $a_n$, where n is the port number of the network. For each port, the incident (applied) and reflected waves are measured. The reflected wave is designed by $b_n$, where n is the port number. When the incident wave travels through a network, its gain and phase are changed by the scattering parameter. For example, when wave $a_1$ travels through a network, the output value of the network is simply the value of the wave multiplied by the relevant S-parameter. S-parameters can be considered as the gain of the network, and the subscripts denote the port numbers. The ratio of the output of port 2 to the incident wave on port 1 is designated $S_{21}$. Likewise, for reflected waves, the signal comes in and out of the same port, hence the S-parameter for the input reflection is designated $S_{11}$.

For a two-port network with matched loads:

$S_{11}$ is the reflection coefficient of the input;
$S_{22}$ is the reflection coefficient of the output;
$S_{21}$ is the forward transmission gain; and
$S_{12}$ is the reverse transmission gain from the output to the input.

S-parameters can be converted to impedance by taking the ratio of $(1+S_{11})$ to $(1-S_{11})$ and multiplying the result by the characteristic impedance, e.g., 50-ohms or 75-ohms. A Smith chart can be used to convert between impedance and S-parameters.

The frequency and impedance, or reflection coefficient ($S_{11}$), of RMPA 120 are measured to provide sensor information and interpretive reports. RMPA 120 is electronically tuned by sensor controller 140 either adjusting oscillator frequency 142 and/or varactors 121 and 122 to find the resonant frequency of the RMPA each time a measurement is taken. The $S_{11}$ (reflection coefficient) parameter is measured in terms of magnitude. The sensor controller 140 seeks to minimize the magnitude of $S_{11}$, meaning RMPA 120 is near its resonant point and 50-ohms.

During an automatic steady state calibration, an iterative process is used in which sensor controller 140 seeks a minimum in $S_{11}$ by adjusting the applied frequency through OSC 124. Once a frequency minimum for $S_{11}$ is found, sensor controller 140 adjusts a bias voltage on varactors 121 and 122 connected to the edges of RMPA 120. The voltage variable capacitances of varactors 121 and 122 are used to fine tune RMPA 120 into resonance, and this action helps drive the impedance as close to 50-ohms as possible. Sensor controller simply measures the $S_{11}$ magnitude minimum. Once voltage adjustments to varactors 121 and 122 find a minimum in $S_{11}$ magnitude, the process is repeated with very fine adjustment steps in frequency control 142 to find an even better minimum. The voltages to varactors 121 and 122 are once again finely adjusted to optimize the minimum.

After calibration, an independent shift away from such minimum in $S_{11}$ magnitude means someone passing through pipe 102 is affecting the balance. The reflection coefficient ($S_{11}$) will change away from the original "calibrated" resonance value. Typically a person passing within the field will cause a peak maximum in the measured data. The rate of change of the measured signal in the area is directly related to the speed of the person passing through the fields of lobes 125 and 126.

$S_{11}$ has both magnitude and phase, a real and imaginary part. Changes in magnitude indicate a disturbance in the EM-field of RMPA 120, and changes in the phase provide the directionality of travel 110-113. RMPA 120 is a linearly polarized antenna, the fields on one edge of RMPA 120 are 180-degrees out of phase from the field on the other edge. With a proper alignment of RMPA 120 in situ, people passing in front of RMPA 120 from left to right, for example in FIG. 1, will produce a phase signature that is 180-degrees out of phase from other people moving right to left. The phase at resonance can be corrected to provide a constant 180-degree shift.

If people 104-105 were to enter the fields of RMPA 120 from the left, for example, the measured phase in $S_{11}$ will roll higher, e.g., increase from 180-degrees. If other people 106-108 were to enter from the right, the phase in $S_{11}$ will decrease from 180-degrees. The process of detecting the direction of travel includes tracking the phase changes between the maximum and minimum in phase roll as each person passes entirely through the field. To calibrate the detection for people only and not small animals, a threshold value 148 is injected.

Living things are substantially comprised of water. Water has a dielectric constant of 81.0. People by volume are about 60% water. The volume of a person is significantly more than the volume of a dog or rat. RMPA 120 is making a bulk dielectric constant measurement, and at these operating frequencies, it is the effective dielectric constant of the bulk of the material near RMPA 120 that changes the electrical properties of resonant frequency and impedance. The bulk change caused by a human is distinguishably different than the bulk changes caused by dogs or smaller animals.

The response versus distance is not linear, but the changes in RMPA electrical properties are linear with linear increases in bulk dielectric changes. In other words, with this, the system can be set to ignore changes below a certain threshold until the threshold associated with a human is detected.

Inventors Larry G. Stolarczyk and Gerald Stolarczyk described a practical way to implement some of electronics equipment that can be adapted for use here in the present invention. See, U.S. Pat. No. 6,633,252, issued Oct. 14, 2003, and titled Radar Plow Drillstring Steering. The essential parts of which are adapted for use as follows.

Figure 2:
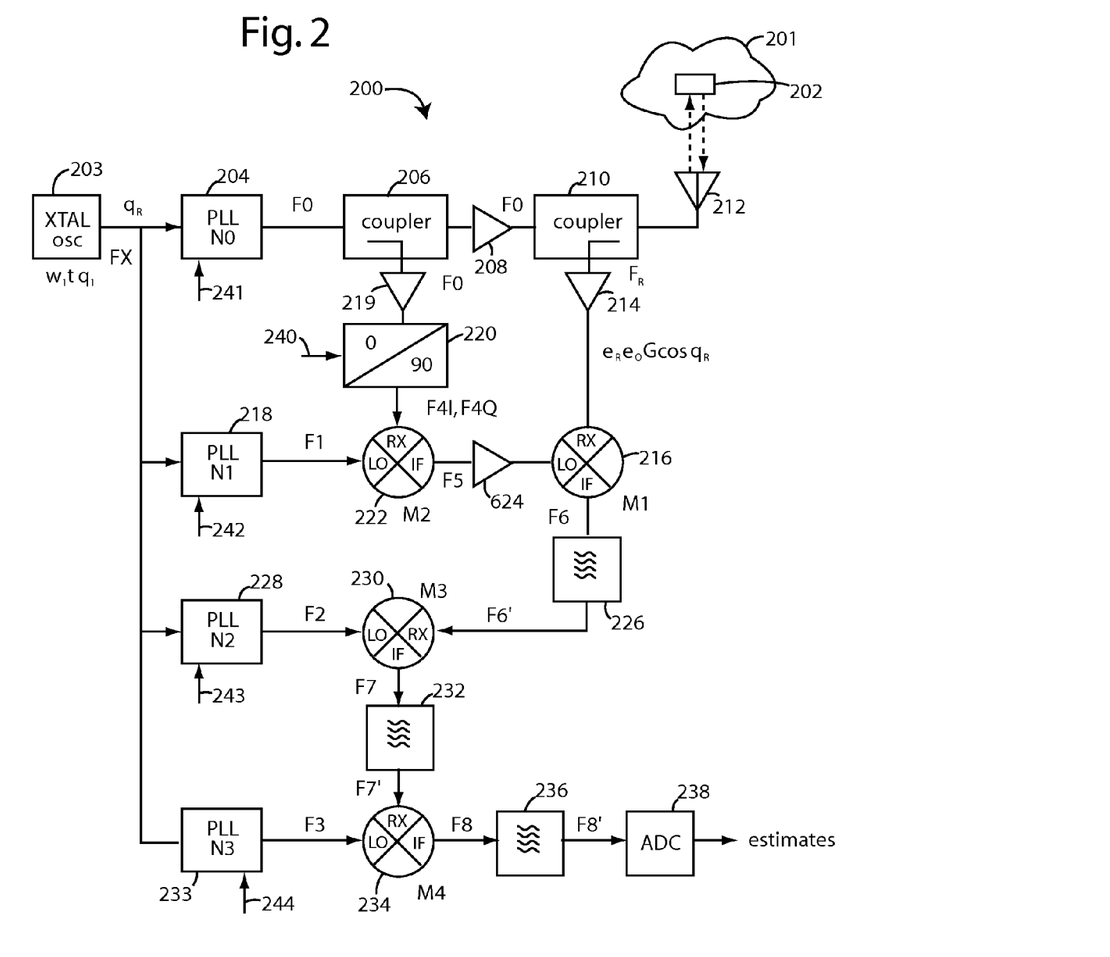
FIG. 2 is a schematic diagram of an electronics embodiment of the present invention, and is one way to implement the electronics portion of the equipment illustrated in FIG. 1.

The system 200 is used to non-invasively penetrate an air space with microwave radio energy to sense people that may be passing through. The system 200 includes a local oscillator 203 that produces a reference frequency (FX) with reference phase ($\theta_1$). A first phase-locked loop (PLL) 204 synthesizes a radio frequency F0, an integer harmonic of FX. The radio frequency F0 is passed to a forward-coupling port of a power splitter 206. An output port is connected to a wideband isolation amplifier 208. A three-port directional coupler 210 one-way couples the transmit signal out to an RMPA 212 which illuminates the coal seam 201 and produces reflected waves from the boundary rock interface 202 with the coal seam 201. A reflection port of the three-port directional coupler 210 is used for measurements, e.g., where $e_R = e_o \Gamma \cos \theta_R$, the reflected energy is a function of the output energy of RMPA 212.

During operation, RMPA 212 is placed in contact with a natural media, wall, or ground surface. An impedance mismatch can result in higher levels of coupler reflection port output voltage or standing wave ratio (VSWR). Any impedance mismatches appearing at any of the ports on a directional coupler will reduce its directivity and isolation between ports. Wideband isolation amplifiers are used to stop reflected waves from reaching the transmitter stages and causing impedance mismatches. The balanced mixers are in particular susceptible to performance degradations under uncontrolled conditions.

Radar signals radiated from the RMPA 212 enter the natural media or ground and are reflected back attenuated and with a change of phase. A wideband isolation amplifier 214 forwards the reflected-wave sample to a first balanced mixer (M1) 216.

A second PLL 218 synthesizes a coherent frequency F1, e.g., 10.70 MHz. A sample of the transmitted signal is provided by the power splitter 206 and a second wideband isolation amplifier 219 to a selectable 0°/90° phase shifter 220. A balanced mixer (M2) 222 provides an intermediate frequency (IF) F5 that is output by a third wideband isolation amplifier 224. The result is a suppressed-carrier signal with upper and lower sidebands offset from the carrier frequency by 10.70 MHz. This in turn mixes with RF in balanced mixer (M1) 216 to produce a first intermediate frequency (IF) F6. A bandpass filter 226 produces an output F6'. A third PLL 228 synthesizes another coherent frequency (F2), e.g., 10.720 MHz. This is combined with F6' in a balanced mixer 230 to produce a relatively low-frequency IF signal F7, e.g., 20.0 KHz.

Both the oscillator phase shift $\theta_1$ and the frequency are multiplied by $N_O$ to create the output frequency $N_O \omega_1$. The phase shift $N_O \theta_1$, is canceled on mixer M1. The coupler reflection port voltage $e_R$ dependence on load plane impedance is mathematically represented by Equation (3). The reflection coefficient ($\Gamma$) is a complex number that can be represented as a vector magnitude with phase angle $\theta_R$. Trigonometric identities are used and filter theory is applied to find that, $$F_{8_I}^1 = k\Gamma \cos \theta_R \text{ and } F_{8_Q}^1 = k\Gamma \sin \theta_R. \tag{6}$$

The ratio of these direct current (DC) values and the inverse tangent values solves for the reflection phase angle $\theta_R$. The constant k is determinable after instrument calibration. The magnitude of the reflection coefficient can be found from either of the above two equations. The measured values of $\Gamma$ and $\theta_R$ can be applied in Equation (3) to determine the load plane impedance.

A bandpass filter 232 produces a signal F7'. A fourth PLL 233 synthesizes another radio frequency (F3). The radio frequency is applied to the LO part of the fourth balanced mixer (M4) 234. Heterodyning produces a signal output F8. An integrating filter 236 processes and outputs a signal F8'. The phase drift ($\theta_1$) in local oscillator 203 is automatically cancelled and does not appear in the output. An analog to digital converter (ADC) 238 outputs a digital signal format, e.g., for further processing by a computer.

A control line 240 selects a 0° or 90° phase-shift through the phase shifter, and this will cause the system 200 to output in-phase or quadrature measurements, e.g., as represented by a DC output voltage of the ADC 238. This control line is typically connected to the same microprocessor that receives the digitized estimates from ADC 238. Such arrangement provides time-multiplexed I and Q amplitude estimates that are indexed to a calibration table, like FIG. 3, to find the depth to the boundary rock interface 202 or the thickness of the coal seam 201 covering the object. The microprocessor is preferably further provided with control signals 241-244 so that the F0-F3 frequencies can be digitally manipulated, e.g., for best transmission penetration and receiver sensitivity on-the-fly as different kinds of media 201 and objects 202 are inspected.

The three-port directional coupler 210 is preferably located near the RMPA antenna 212 and is connected to it by a short coaxial cable or strip line. The RMPA antenna 212 is preferably placed close to a natural media surface so the driving-point impedance of an antenna can be adjusted to match the characteristic impedance of the coupler. This technique will maximize the sensitivity of the coupler reflection port signal to small changes in antenna driving-point impedance. An antenna driving-point impedance adjustment is therefore preferred, e.g., with a variable slot built into the antenna structure capacitor.

The balanced mixer placed between the coupler reflected port and the first balanced mixer is such that the signals that modulate the coupler reflection output are phase coherent with the transmit signal. Sidebands are thus produced that represent the phase and amplitude information in the reflection signals. The rest of the circuitry demodulates the information from the carrier.

The output signal of the second balanced modulator (M2) is mixed with a coherent sample of the transmit signal in the first balanced mixer. After filtering, such signal will faithfully replicate the reflection port signal. This simplifies the transceiver design and enables accurate signal measurements with low cost synchronous detection circuits.

Figure 3:
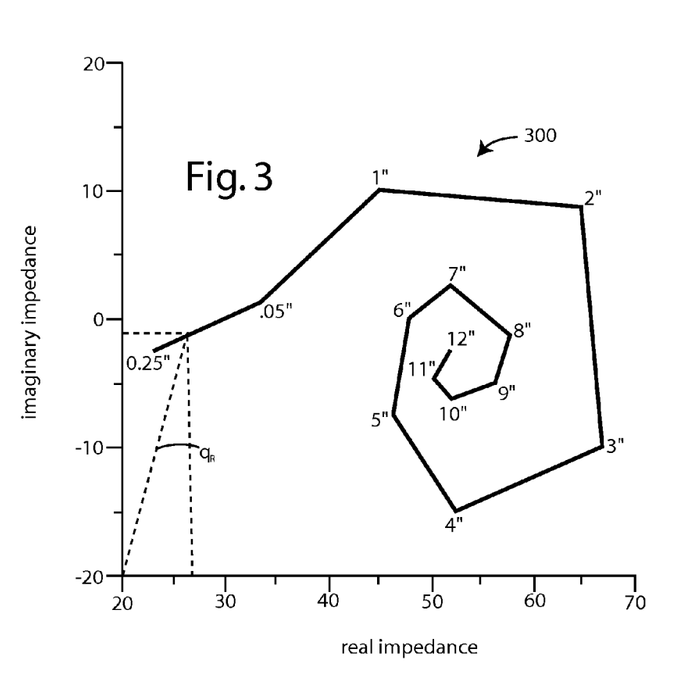
FIG. 3 is a graph of the typical driving-point real and imaginary impedance variations seen in the system of FIG. 1.

FIG. 3 charts the relationships that typically develop between the RMPA antenna and the depth to the object and measured values for real (in-phase, I) and imaginary (quadrature-phase, Q). The two vector components of RMPA impedance, real and imaginary, vary differently as a nearby media layer thickness changes. Plotting the imaginary on the Y-axis and the real on the X-axis of a graph yields a calibration curve 300 that spirals to a vanishing point with increasing layer thickness, e.g., from 0.25 to twelve inches.

Figure 4:
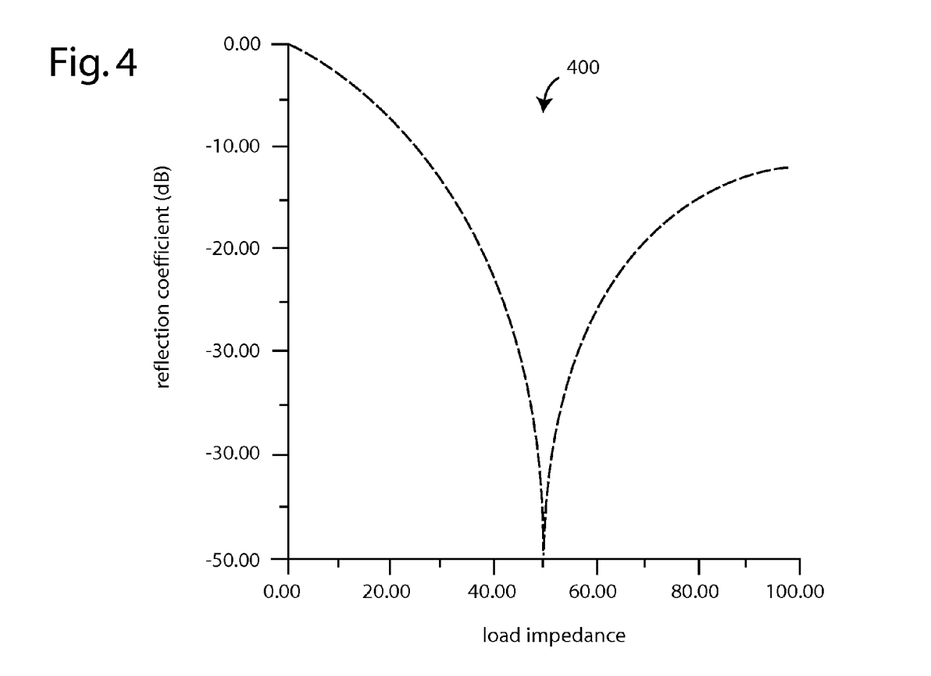
FIG. 4 is a graph of a theoretical impedance response of a directional-coupler reflection port of FIG. 2.

FIG. 4 illustrates the theoretical impedance response 400, e.g., as seen at the reflected-wave sample port of directional coupler 210. The applied signal ($e_O$) from isolation amplifier 208 is assumed to be constant. Detection sensitivity is best on the steepest parts of the curve. Sensitivity is maximum when the RMPA driving point impedance matches the characteristic impedance of the directional coupler.

A method embodiment of the present invention provides for the calibration of such RMPA sensor antennas. Sets of polynomial equations are constructed with independent variables (H) that allow any given antenna driving point impedance value to be measured, and represented as a calibration function with independent variable (H). The difference between the measured and calibration polynomial value is used to detect and image the coal seam.

Referring again to FIG. 2, the crystal oscillator phase shift $\theta_1$ is multiplied by the full multiplication factor $N_O$ and the frequency of the crystal oscillator is multiplied by $N_O$ creating the output frequency $N_O \omega_1$. After filtering, the phase shift $N_O \theta_1$, is canceled on balanced mixer M1. The coupler reflection port voltage $e_R$ dependence on driving point impedance is mathematically represented by Equation (3). The reflection coefficient ($\Gamma$) is a complex number that can be represented as a vector magnitude with phase angle $\theta_R$. Using trigonometric identities and applying filter theory, it can be shown that, $$F_8 I = k\Gamma \cos \theta_R \text{ and } F_8 Q = k\Gamma \sin \theta_R. \quad (12)$$

The ratio of these direct current (DC) values can be used to solve for the inverse tangent values. And the reflection phase angle $\theta_R$ can be readily determined. Calibration of the instrument will determine the correct constant K. The magnitude of the reflection coefficient can be found from either of the above two equations. The circuits isolate the phase shifter from any blaring reflected signal. The measured values of $\Gamma$ and $\theta_R$ can be applied in Equation (3) to determine the driving point impedance.

The following equations help further describe the necessary working conditions of the system 200 in FIG. 2, and illustrate what each functional element must do to process the signals involved. FR is the reflected-wave output from the reverse port of directional coupler 210. FX is the output of oscillator 203. F0 is the output of PLL 204. F1 is the output of PLL 218. F2 is the output of PLL 228. F3 is the output of PLL 233. F4I and F4Q are the selected in-phase and quadrature outputs of phase shifter 220. F5 is the output of mixer 222. F6 is the output of mixer 216. F6' is the filtered output of bandpass filter 226. F7 is the output of mixer 230. F7' is the filtered output of bandpass filter 232. F8 is the output of mixer 234. F8' is the filtered output of bandpass filter 236.

$$FX = A \cos(\omega_1 t + \theta_1)$$

$$F0 = B \cos(N_0 \omega_1 t + N_0 \theta_1)$$

$$F1 = C \cos(N_1 \omega_1 t + N_1 \theta_1)$$

$$F2 = C \cos(N_2 \omega_1 t + N_2 \theta_1)$$

$$F4I = D \cos(N_0 \omega_1 t + N_0 \theta_1)$$

$$F4Q = D \sin(N_0 \omega t + N_0 \theta_1)$$

$$FR = E\Gamma \cos(N_0 \omega_1 t + N_0 \theta_1 + \theta_R)$$

$$N_2 - N_1 = 1$$

Placing the quadrature hybrid into the 0° position yields:

$$F5I = F1 \times F4I = CD \cos(N_1 \omega_1 t + N_1 \theta_1) \cos(N_0 \omega_1 t + N_0 \theta_1) = \frac{CD}{2}[\cos[(N_1 + N_0)\omega_1 t + (N_1 + N_0)\theta_1] + \cos[(N_1 - N_0)\omega_1 t + (N_1 - N_0)\theta_1]]$$

$$F6I = F5 \times FR = \frac{CDE\Gamma}{2}[\cos[(N_1 + N_0)\omega_1 t + (N_1 + N_0)\theta_1] \times \cos(N_0 \omega_1 t + N_0 \theta_1 + \theta_R) + \cos[(N_1 - N_0)\omega_1 t + (N_1 - N_0)\theta_1] \times \cos(N_0 \omega_1 t + N_0 \theta_1 + \theta_R)] =$$

$$\frac{CDE\Gamma}{4}[\cos[(N_1 + 2N_0)\omega_1 t + (N_1 + 2N_0)\theta_1 + \theta_R] + \cos(N_1 \omega_1 t + N_1 \theta_1 - \theta_R) + \cos(N_1 \omega_1 t + N_1 \theta_1 + \theta_R) + \cos[(N_1 - 2N_0)\omega_1 t + (N_1 - 2N_0)\theta_1 + \theta_R]$$

After filtering:

$$F^1 6I = \frac{CDE\Gamma}{4}[\cos(N_1 \omega_1 t + N_1 \theta_1 - \theta_R) + \cos(N_1 \omega_1 t + N_1 \theta_1 + \theta_R)] = \frac{CDE\Gamma}{2}\cos(\theta_R)\cos(N_1 \omega_1 t + N_1 \theta_1)$$

$$F7I = F2 \times F^1 6I = \frac{C^2 DE\Gamma}{4}\cos(\theta_R)[\cos(N_2 \omega_1 t + N_2 \theta_1)\cos(N_1 \omega_1 t + N_1 \theta_1)] = \frac{C^2 DE\Gamma}{4}\cos(\theta_2)[\cos[(N_2 + N_1)\omega_1 t + (N_2 + N_1)\theta_1] + \cos[(N_2 - N_1)\omega_1 t + (N_2 - N_1)\theta_1]]$$

After filtering:

$$F^1 7I = \frac{C^2 DE\Gamma}{4}\cos(\theta_R)\cos[(N_2 - N_1)\omega_1 t + (N_2 - N_1)\theta_1] \text{ where } N_2 - N_1 = 1,$$

$$F^1 7I = \frac{C^2 DE\Gamma}{4}\cos(\theta_R)\cos(\omega_1 t + \theta_1) \quad F8I =$$

$$FX \times F^1 7I = \frac{AC^2 DE\Gamma}{4}\cos(\theta_R)\cos(\omega_1 t + \theta_1)\cos(\omega_1 t + \theta_1)$$

and applying filter:

$$F^18I = \frac{AC^2DE\Gamma}{4}\cos(\theta_R)$$

Switching the quadrature hybrid to the 90° position and following similar techniques as shown above, reveals that:

$$F^18Q = \frac{AC^2DE\Gamma}{4}\sin(\theta_R)$$

Let $I = F^18Q$ and $Q = F^18Q$ and thus, $$\Gamma \propto \sqrt{I^2 + Q^2} \text{ and,}$$

$$\theta_R = \tan^{-1}\frac{Q}{I}$$

FIG. 5 represents an RMPA 500 like that in FIG. 1. RMPA 500 is connected to an electronics controller 502 through a feedpoint 504 with a characteristic impedance of 50-ohms. Such feedpoint 504 passes through a small opening on a copper foil backplane 506 on a fiberglass-epoxy FR4 substrate 508. A copper foil patch 510 is deposited on the substrate 508 and has a ground connection to the backplane 506 through a ground post 512. The view of FIG. 5 is taken through a normal plane that longitudinally bisects both the ground post 512 and feedpoint 504. A varactor 514 is typical of many that can be connected to be voltage-controlled by electronics controller 502 to enable fine tuning of the resonant frequency of RMPA 500 during calibration and measurement sensing. The electronics controller 502 is able to measure parameter $S_{11}$ at the feedpoint 504 and issue interpretive reports to users.

At resonance, the electromagnetic fields radiate away from RMPA, as shown in FIG. 5. A linearly polarized electric field fringes from the edges of the metalized, copper foil parts of RMPA 500. Such type of polarization is an important operational element of the ORCUS system 100 of FIG. 1, this polarization enables the detection and monitoring of movement and indicating the direction of travel of the things detected. As applied here, antenna pattern 600 has a very broad 3-dB beam width of ±30 degrees from the perpendicular to the plane of patch 510. This pattern is important in the present applications because the wide antenna pattern allows a large area to be monitored for people traffic. And, for example, in the confined space of concrete pipe 102 there would be no practical way to sneak past undetected.

Figure 6A:
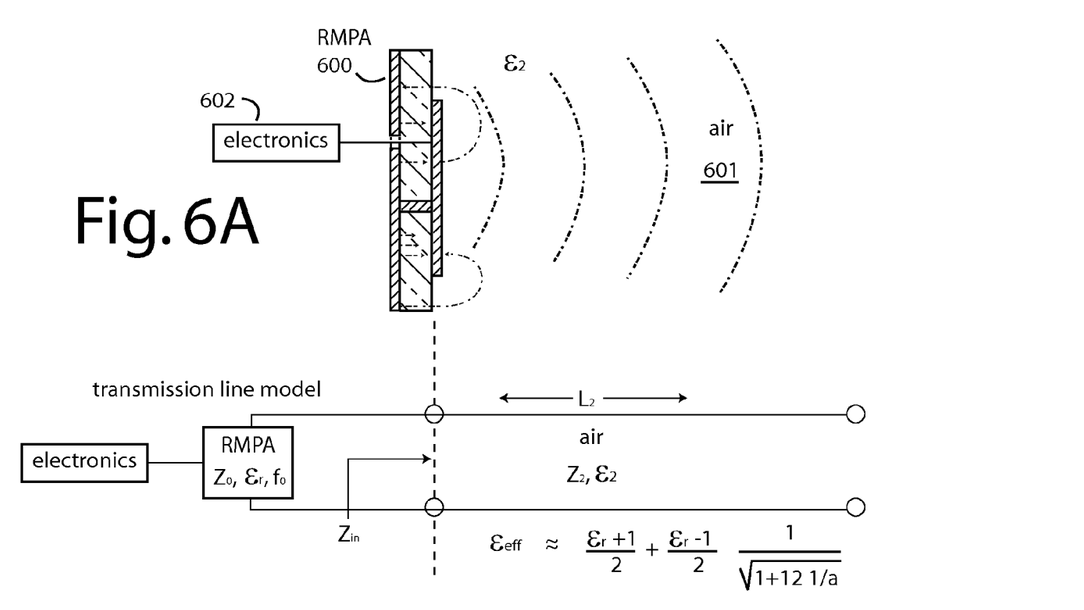
Figure 6B:
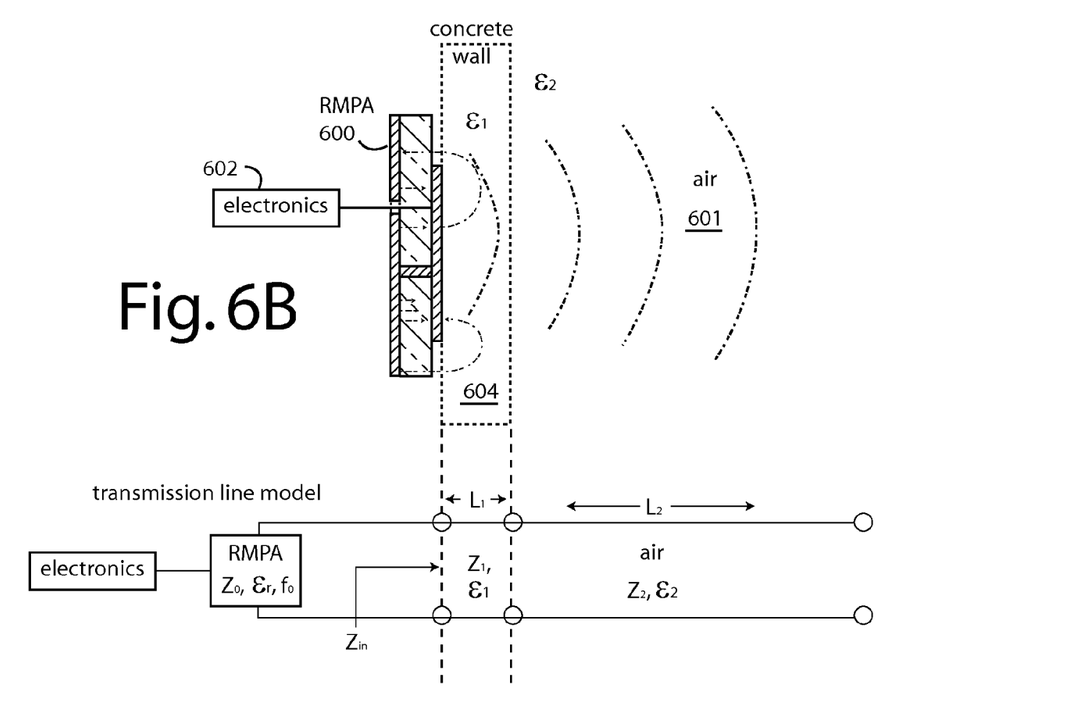
Figure 6C:
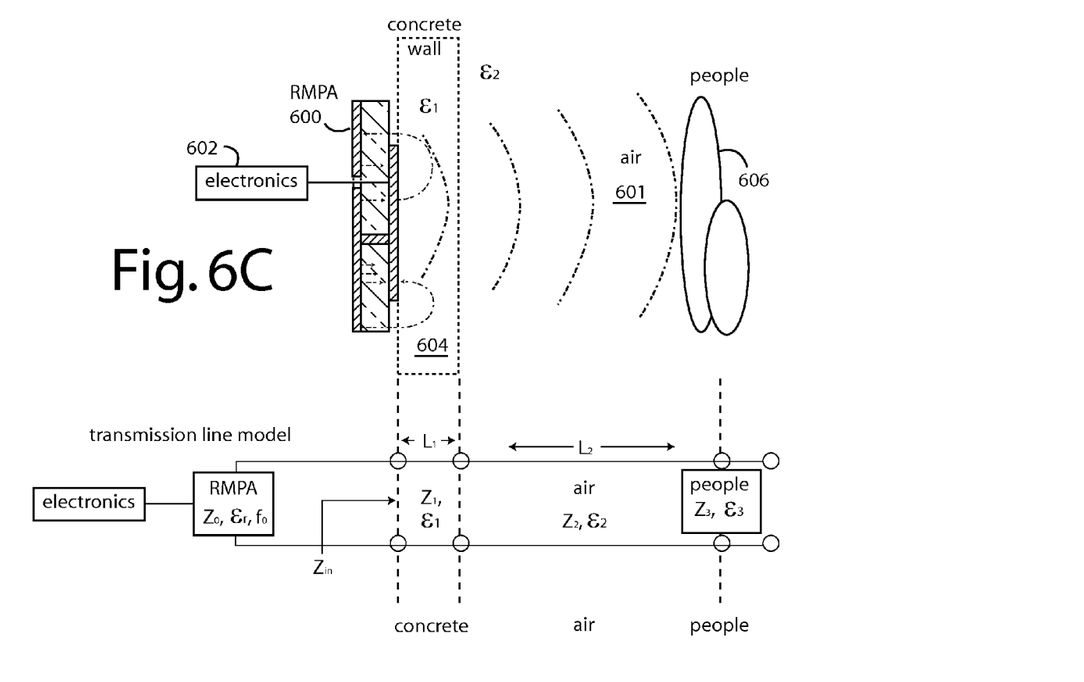

FIG. 6A represents a side-view of a RMPA 600 radiating into free space or air 601. A transmission line model can be used to describe the problem, and such are included at the bottoms of FIGS. 6A-6C. An RMPA electronics package 602 is configured to monitor the resonant frequency ($f_O$) and the resonant impedance ($Z_O$) parameters of RMPA 600. The resonant frequency is approximated by, $$f_o = \frac{kc}{2\pi a\sqrt{\varepsilon_{eff}}}, \quad (1)$$

where, k is a constant based on the RMPA operational mode ($TM_{11}$);

c is the speed of light;

a is the aperture area of the RMPA; and $\in_{eff}$ is the effective dielectric constant of the material in front of the RMPA.

The resonant impedance of RMPA 600 will be, $$Z_{in} = Z_o\left[\frac{Z_2 + jZ_o\tan\beta L_2}{Z_o + jZ_2\tan\beta L_2}\right], \quad (2)$$

where, $Z_O$ is the impedance of the RMPA (e.g., 50Ω);

$$Z_2 = \sqrt{\frac{\mu_2}{\varepsilon_2}}$$

is the wave impedance in the media;

$\mu_2$ is the magnetic permeability and for almost all cases $\mu_2=1$;

$\in_2$ is the dielectric constant of the media;

$$\beta = \frac{2\pi}{\lambda}$$

is the phase constant in the media;

$$\lambda = \frac{c}{f_o\sqrt{\varepsilon_2}}$$

is the wavelength of the signal in the media; and $L_2$=the lateral distance away from the RMPA.

For Equations (1) and (2), the resonant frequency and impedance are directly dependent upon the effective dielectric constant of the media.

FIG. 6B takes the next step, RMPA 600 is deployed behind a concrete wall 604 which intervenes with air space 601. In this case, the equations for the resonant frequency and impedance differ from Equations (1) and (2) in that the effective dielectric constant of Equation (1) becomes instead, $$\varepsilon_{eff} \propto \frac{\varepsilon_{eff1}\varepsilon_{eff2}}{\varepsilon_{eff1} + \varepsilon_{eff2}}, \quad (3)$$

where, $\in_{eff1}$ is the effective dielectric constant as given in FIG. 6A, and, $$\varepsilon_{eff2} = \frac{\varepsilon_r + \varepsilon_1}{2} + \frac{\varepsilon_r - \varepsilon_1}{2}\left[\frac{1}{\sqrt{1 + 12/a}}\right].$$

The resonant impedance of RMPA 600 shown in FIG. 6B now takes the form, $$Z_{in} = Z_o \left[ \frac{Z_l + jZ_o \tan\beta L_1}{Z_o + jZ_l \tan\beta L_1} \right], \quad (4)$$

where, $Z_O$ is the impedance of the RMPA (e.g., 50Ω);

$L_1$ is the thickness of the concrete wall 604;

$$Z_l = Z_1 \left[ \frac{Z_2 + jZ_1 \tan(\beta L_2)}{Z_1 + jZ_2 \tan(\beta L_2)} \right];$$

$$Z_1 = \sqrt{\frac{\mu_1}{\varepsilon_1}};$$

$$Z_2 = \sqrt{\frac{\mu_2}{\varepsilon_2}};$$

for air: $Z_2 = 377\Omega$; and $L_2$=the lateral, linear dimension of the air space.

There are direct relationships with the effective dielectric constant for both the resonant frequency and the resonant impedance. Any changes appearing in the dielectric constant will be reflected mainly in changes in the resonant parameters.

FIG. 6B represents the steady state conditions for which electronics 602 would calibrate automatically to RMPA 600.

FIG. 6C extends FIG. 6B by introducing people 608 into air space 601 within the detection range of RMPA 600. The resonant frequency is still provided by Equation (1), but the effective dielectric constant will now be, $$\frac{1}{\varepsilon_{eff}} = \frac{1}{\varepsilon_{eff1}} + \frac{1}{\varepsilon_{eff2}} + \frac{1}{\varepsilon_{eff3}}, \quad (5)$$

where, $$\varepsilon_{eff3} = \frac{\varepsilon_2 + \varepsilon_3}{2} + \frac{\varepsilon_2 - \varepsilon_3}{2} \left[ \frac{1}{\sqrt{1 + 12/a_3}} \right];$$

Here, $a_3$ is the size of the RMPA aperture at a position $L_1 + L_2$ away from RMPA 600;

$$\varepsilon_{eff2} = \frac{\varepsilon_1 + \varepsilon_2}{2} + \frac{\varepsilon_1 - \varepsilon_2}{2} \left[ \frac{1}{\sqrt{1 + 12/a_2}} \right];$$

And, $a_2$ is the size of the RMPA aperture at a position $L_1$ away from RMPA 600; and $$\varepsilon_{eff1} = \frac{\varepsilon_r + \varepsilon_1}{2} + \frac{\varepsilon_r - \varepsilon_1}{2} \left[ \frac{1}{\sqrt{1 + 12/a}} \right];$$

For the case shown in FIG. 6C, the resonant impedance of RMPA 600 will be, $$Z_{in} = \frac{Z_o Z_B}{Z_o + Z_B}, \quad (6)$$

where, $Z_O$ is the impedance of the RMPA (e.g., 50Ω);

$$Z_B = Z_1 \left[ \frac{Z_A + jZ_1 \tan(\beta L_1)}{Z_1 + jZ_A \tan(\beta L_1)} \right];$$

$L_1$ is the thickness of the concrete wall;

$$Z_1 = \sqrt{\frac{\mu_1}{\varepsilon_1}}$$

is the wave impedance in concrete;

$$Z_A = Z_2 \left[ \frac{Z_3 + jZ_2 \tan(\beta L_2)}{Z_2 + jZ_3 \tan(\beta L_2)} \right];$$

$L_2$ is the distance to the person from the concrete wall;
$Z_2$ is the wave impedance in air or 377Ω; and $$Z_3 = \sqrt{\frac{\mu_3}{\varepsilon_3}} \approx 37\Omega$$

is the wave impedance of a human body.

Human bodies are about 66% water. The dielectric constant of water is about eighty-one, which yields a wave impedance of less than 37Ω. For concrete, the wave impedance is about 150Ω, and the wave impedance of air is approximately 377Ω. As a result, the human body appears as a very low impedance path for signals from RMPA 600. It is a virtual short, which means that most of the energy of the RMPA signal will be reflected back to the source. Therefore, a RMPA-based sensor system can be employed as a highly sensitive detector of water-intensive, organic bodies, such as people.

The electronics 602 constantly measures the resonant frequency and the resonant impedance of RMPA 600. An organic, water-intensive body passing in front of the sensor will dramatically change these characteristics. Since the impedance is a complex number, having a distinct magnitude and phase, the directionality of motion can be determined.

Figure 7:
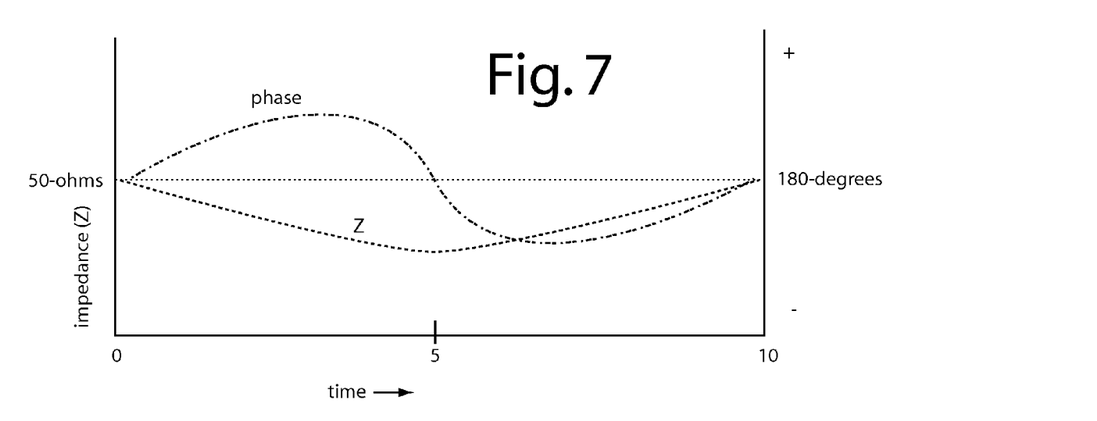
FIG. 7 is a graph representing the changes in magnitude and phase of the input impedance ($Z_{in}$) of the RMPA that typically occur as people walk past the RMPA's of FIGS. 1 and 6C.

FIG. 7 represents an exemplary case in which a person begins walking toward system 100 (FIG. 1) from out of range, then into range, through concrete pipe 102 under RMPA 120, and then out the other end out of range. For example, a transit time of ten seconds. Such walk begins out-of-range at time=0, the person passes under RMPA 120 at time=5, and goes out-of-range on the other side at time=10. A change in loading is caused by the changing positions and nearness of the person from time=0 to time=10, and the resonant frequency of RMPA 120 is affected. So each new resonant frequency is found by controlling OSC 124 to produce a minimum in the impedance of RMPA 120. That new impedance is the measurement that is collected at that particular time, and a series of such measurements is represented in FIG. 7. The ± phase of the impedance-Z tells which side of RMPA 120 the person is on, and the magnitude of impedance-Z tells how near they are. A peak in the magnitude will also be proportional to how large the person or group of people are. More complex patterns will be generated by random passings of many individuals.

Equation (5) and the associated definitions of the variables therein indicate that the RMPA is actually making a bulk dielectric constant measurement. This performance aspect is important because, even though the transmission model relies on the theory of small reflections to balance the system, the bulk dielectric measurement concept eliminates the need for any analysis requiring reflection phenomena, which is a characteristic of radar-based systems.

In conventional radar applications, a relatively large signal is transmitted with the hope of measuring a relatively faint return signal. One difficulty in operating a radar type system in a subsurface infrastructure environment is a small signal of interest has to be extracted from many, often stronger reflected signals arriving at the receiver. Radar systems are effectively blind in applications in which the return signal from a first interface can swamp the receiver, leaving the radar unable to detect anything else that may be near the radar antenna.

Embodiments of the present invention do not have such limitations. The RMPA's here and their associated electronics are not used to detect small signals in the presence of very large signals. Instead, the RMPA's are used to make repetitive and continuous measurements of changes in the bulk dielectric constant as targets of interest pass by.

Figure 8:
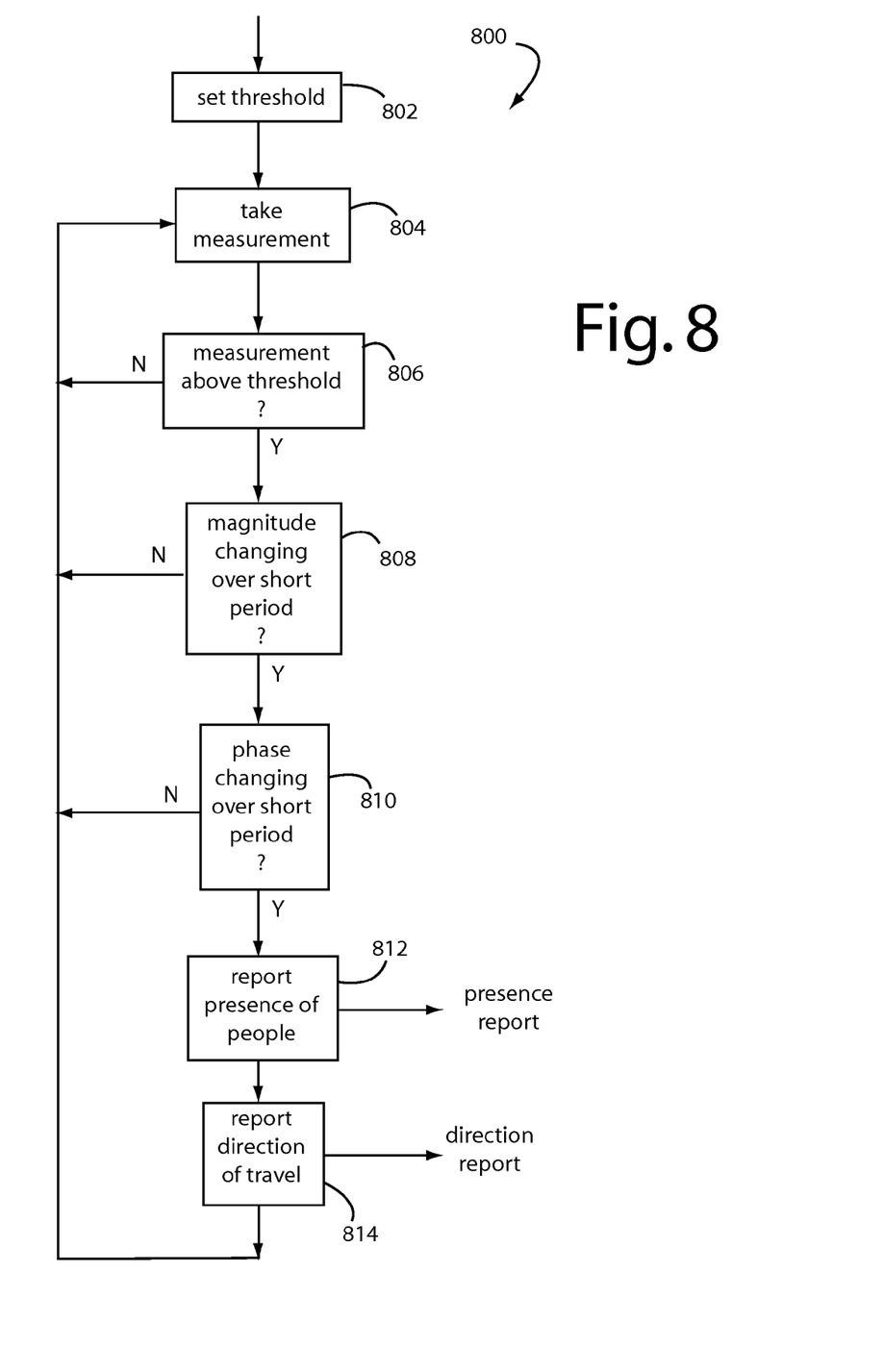
FIG. 8 is a flowchart diagram of a computer program for a microcomputer that when executed performs the functions of the interpreter device of FIG. 1.

FIG. 8 represents a computer program 800 in an embodiment of the present invention for a microcomputer that when executed performs the functions of the interpreter device 146 of FIG. 1 and electronics 602 in FIGS. 6A-6C. Any changes in magnitude and phase of the input impedance ($Z_{in}$) of the RMPA that occur, e.g., as people walk past the RMPA's of FIGS. 1 and 6C are analyzed. A subroutine 802 allows a user to set the minimum trigger threshold so that the system will not respond to non-human objects. A subroutine 804 uses the electronics disclosed in FIGS. 1-6C to obtain an input impedance ($Z_{in}$) of the RMPA. Such measurement include the magnitude and phase of the $Z_{in}$. A subroutine 806 tests the magnitude of the $Z_{in}$ to see if it exceeds a threshold magnitude change. If not, computer program 800 returns to subroutine 804 to take more measurements of $Z_{in}$. If yes, a subroutine 808 analyzes the present and recent measurements of $Z_{in}$ to see if the magnitude of $Z_{in}$ is changing over a relatively short period of time, e.g., one second. If not, computer program 800 returns to subroutine 804 to take more measurements of $Z_{in}$. If yes, a subroutine 810 analyzes the present and recent measurements of $Z_{in}$ to see if the phase of $Z_{in}$ is changing over a relatively short period of time, e.g., one second. If not, computer program 800 returns to subroutine 804 to take more measurements of $Z_{in}$. If yes, a subroutine 812 reports or annunciates to a local or remote user that people are or have passed by the RMPA. A subroutine 814 further reports a direction of travel that such people have passed by the RMPA. The direction of travel is ascertained from the phase measurements of $Z_{in}$, and how they correlate to magnitude measurements at the same instants. The computer program 800 then loops around to subroutine 804 to take more measurements of $Z_{in}$. Each measurement of Zin is obtained while the RMPA is in resonance. The sensor controller 140 (FIG. 1), e.g., continually hunts for the optimal frequency from OSC 124 that will produce a minimum $Z_{in}$. The minimum obtainable $Z_{in}$ will change as people enter and leave the area in front of RMPA 120. The function of sensor controller 140 could also be included in computer program 800.

A method embodiment of the present invention for detecting the movements of living things underground includes radiating the earth and an underground passageway with a resonant microwave patch antenna (RMPA). The frequency of a continuous wave (CW) transmission applied to the RMPA in real-time is maintained to match the resonant frequency of the RMPA as it changes with variations in the loading caused by the earth and underground passageway and anything inside the underground passageway. Each minimum in the instantaneous input impedance of the RMPA is interpreted as an indication of its being operated at its resonant frequency given how it is loaded. The movements of living things underground are announced after analyzing how the instantaneous input impedance of the RMPA changes over time. The direction of movement of living things underground can be further determined by analyzing how the phase angle of the instantaneous input impedance of the RMPA changes over time.

Although the present invention has been described in terms of the presently preferred SPS receivers, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A movement detection system, comprising:
 a microwave antenna able to transmit microwave frequency signals into a space;
 a sensor controller connected to the microwave antenna, and configured to continually measure the impedance of the microwave antenna while it transmits said microwave frequency signals into said space; and
 an interpretive device connected to receive impedance measurements from the sensor controller, and configured to analyze and report short-term changes in the magnitude and phase angles of individual impedance measurements of the microwave antenna as the passing of things and their respective directions through said space.

2. The movement detection system of claim 1, further comprising:
 an oscillator for driving the microwave antenna into resonant operation.

3. The movement detection system of claim 2, wherein the sensor controller controls the oscillator such that the microwave antenna is continually in resonant operation.

4. The movement detection system of claim 1, further comprising:
 at least one varactor connected to the microwave antenna and useful for fine tuning the resonant frequency of the microwave antenna.

5. A people detection and movement system, comprising:
 a resonant microstrip patch antenna (RMPA) for mounting on an outside wall of a tunnel or concrete pipe and faced inward to detect the presence and direction of movement of people inside, wherein the RMPA has a front lobe and a back lobe that react differently to dielectric changes in their fringing and propagating e-fields according to relative direction;

a sensor controller connected to the RMPA to drive the RMPA with a variable frequency, and to measure the impedance and phase ($Z_{in}$) of the RMPA while keeping the RMPA at frequency resonance; and an interpretive device that interprets particular changes in the resonant frequency, impedance, and phase of the RMPA as being the movement of people nearby;

wherein, live objects moving near the RMPA affect the dielectric constant of any intervening wall and surrounding air, and thereby also affect the resonant frequency, impedance, and phase of the RMPA.

6. The people detection and movement system of claim 5, wherein a phase change is indicative of a direction people are moving relative to the RMPA, and a delta frequency and impedance change indicates the mass and proximity of the people to the RMPA.

7. The people detection and movement system of claim 5, further comprising:

a threshold detector to screen out any false positives and movements of small animals;

wherein, an interpretation of changes in resonant frequency, impedance, or phase of $Z_{in}$, is output to annunciate people movement and their direction of travel.

8. The people detection and movement system of claim 5, further comprising:

a mounting for the RMPA for covert installation on an outside wall of a tunnel or concrete pipe which faces the RMPA inward to detect the presence and direction of movement of people inside.

9. A method for detecting the movements of living things underground, comprising:

radiating the earth and an underground passageway with a resonant microwave patch antenna (RMPA):

maintaining the frequency of a continuous wave (CW) transmission applied to the RMPA in real-time to match the resonant frequency of the RMPA as it changes with variations in the loading caused by said earth and underground passageway and anything inside said underground passageway;

interpreting a minimum in the instantaneous input impedance of the RMPA as an indication of its being operated at its resonant frequency given how it is loaded; and announcing the movements of living things underground by analyzing how the instantaneous input impedance of the RMPA changes over time.

10. The method of claim 9, further comprising:

announcing the direction of movement of living things underground by analyzing how the phase angle of the instantaneous input impedance of the RMPA changes over time.

\* \* \* \* \*